(12) United States Patent
Lagowski et al.

(10) Patent No.: US 8,912,799 B2
(45) Date of Patent: Dec. 16, 2014

(54) ACCURATE MEASUREMENT OF EXCESS CARRIER LIFETIME USING CARRIER DECAY METHOD

(71) Applicant: Semiconductor Physics Laboratory Co., Ltd., Budapest (HU)

(72) Inventors: Jacek Lagowski, Tampa, FL (US); Marshall D. Wilson, Tampa, FL (US)

(73) Assignee: Semiconductor Physics Laboratory Co., Ltd., Budapest (HU)

( * ) Notice: Subject to any disclaimer, the term of this patent is extended or adjusted under 35 U.S.C. 154(b) by 130 days.

(21) Appl. No.: 13/673,762

(22) Filed: Nov. 9, 2012

(65) Prior Publication Data

US 2013/0169283 A1 Jul. 4, 2013

Related U.S. Application Data

(60) Provisional application No. 61/558,326, filed on Nov. 10, 2011.

(51) Int. Cl.
*G01R 31/00* (2006.01)
*G01R 31/305* (2006.01)
*G01R 31/308* (2006.01)
*G01R 31/26* (2014.01)
*G01R 31/265* (2006.01)

(52) U.S. Cl.
CPC .......... *G01R 31/2656* (2013.01); *G01R 31/305* (2013.01); *G01R 31/308* (2013.01); *G01R 31/2648* (2013.01)
USPC ................. 324/501; 324/754.22; 324/754.23; 324/762.01

(58) Field of Classification Search
USPC ............... 324/500, 501, 719, 754.22, 754.23, 324/762.01, 762.05
See application file for complete search history.

(56) References Cited

U.S. PATENT DOCUMENTS 3,697,873 A * 10/1972 Mazur ...................... 324/762.01
4,090,132 A * 5/1978 Alexander ............... 324/762.01
(Continued)

OTHER PUBLICATIONS

Aberle, A.G. et al., "On the Data Analysis of Light-Biased Photoconductance Decay Measurements", *J. Appl. Phys.* 79(3):1491-1496, (1996).

(Continued)

*Primary Examiner* — Hoai-An D Nguyen
(74) *Attorney, Agent, or Firm* — Fish & Richardson P.C.

(57) ABSTRACT

A method is described for accurate measuring of the excess carrier lifetime on a semiconductor sample from the carrier decay after termination of the excitation pulse imposed on the steady-state carrier excitation. The method includes determining a quality of decay parameter using progressing segments in each carrier decay; establishing an accurate lifetime measurement multiparameter domain for experimental variables whereby the quality of decay parameter falls within prescribed limits from the ideal exponential decay value of QD=1; and determining an excess carrier lifetime for the semiconductor sample based on experimental measurement conditions within the domain and the quality of decay value within the predetermined range indicative of an accurate excess carrier lifetime measurement.

14 Claims, 15 Drawing Sheets

(56) References Cited

U.S. PATENT DOCUMENTS

| | | | |
|---|---|---|---|
| 5,049,816 A * | 9/1991 | Moslehi | 324/762.02 |
| 5,477,158 A * | 12/1995 | Shafer et al. | 324/750.19 |
| 5,867,034 A * | 2/1999 | Sokolov et al. | 324/754.23 |
| 6,049,220 A * | 4/2000 | Borden et al. | 324/754.23 |
| 7,898,280 B2 * | 3/2011 | Kamieniecki | 324/762.01 |
| 8,008,929 B2 * | 8/2011 | Allibert et al. | 324/642 |
| 8,314,628 B2 * | 11/2012 | Clarysse et al. | 324/754.23 |
| 2009/0039478 A1 * | 2/2009 | Bucher et al. | 257/655 |
| 2010/0188094 A1 * | 7/2010 | Allibert et al. | 324/501 |
| 2013/0146787 A1 * | 6/2013 | Giesecke | 250/459.1 |

OTHER PUBLICATIONS

Basore, P.A. et al., "Microwave-Detected Photoconductance Decay", *21st IEEE Photovoltaic Specialist Conf.*, pp. 374-379 (1990).

Cousins, P.J. et al., "Experimental Verification of the Effect of Depletion-Region Modulation on Photoconductance Lifetime Measurements", *J Appl. Phys.* 95(4):1854-1858, (2004).

Lauer, K. et al., "Detailed Analysis of the Microwave-Detected Photoconductance Decay in Crystalline Silicon", *J. Appl. Phys.* 104:104503-1-104503-9, (2008).

Macdonald, D. et al., "On the Use of a Bias-Light Correction for Trapping Effects in Photoconductance-Based Lifetime Measurements of Silicon", *J. Appl. Phys.*, 89(5):2772-2778, (2001).

Schöfthaler, M. et al., "Sensitivity and Transient Response of Microwave Reflection Measurements", *J. Appl. Phys.* 77(7):3162-3173 (1995).

Wilson, M. et al., "Improved QSS-µPCD Measurement with Quality of Decay Control: Correlation with Steady-State Carrier Lifetime", *Solar Energy Materials and Solar Cells* 106:66-70 (2012).

Wilson, M. et al., "Unified Lifetime Measurement for Silicon PV", *Proceedings of the 38th IEEE PVSC*, Austin, TX, pp. 001860-001863, (2011).

\* cited by examiner

ACCURATE MEASUREMENT OF EXCESS CARRIER LIFETIME USING CARRIER DECAY METHOD

CROSS-REFERENCE TO RELATED APPLICATIONS

This application claims benefit if Provisional Application No. 61/558,326, entitled "ACCURATE MEASUREMENT OF EXCESS CARRIER LIFETIME USING CARRIER DECAY METHOD," filed on Nov. 10, 2011, the entire content of which is hereby incorporated by reference.

BACKGROUND

This disclosure relates to measuring excess charge carrier lifetime in semiconductor samples using noncontact techniques. The lifetime describes how long, after injection, the excess charge carriers remain free to move before they are annihilated by recombination. The recombination can proceed via recombination centers related to impurities and defects that reduce lifetime values. Lifetime measurements can provide very sensitive diagnostic methods for monitoring such contamination and defects that in silicon are often related to metal contaminants (Fe, Cu, Ni) and to microdefects involving oxygen. Long carrier lifetimes are especially important for performance of semiconductor devices that utilize excess free carriers, such as detectors and CCD imagers or photovoltaic devices, such as solar cells. High carrier lifetime and low surface recombination are desired for achieving high solar cell efficiency. Therefore, in silicon photovoltaics the measurement of excess carrier lifetimes can be used for initial prescreening and rejection of wafers with short lifetime. Carrier lifetimes can also be used for monitoring solar cell fabrication steps and prediction of cell performance.

Lifetime measurements versus steady-state illumination intensity and corresponding excess carrier injection level have important applications in silicon photovoltaics. Such characteristics are used for determination of the emitter saturation current and the open circuit voltage which are critical parameters for engineering high efficiency solar cells.

Carrier decay methods carry the advantage of direct lifetime determination without the need of any material and wafer parameters. The most common of these methods is the microwave detected photoconductance decay technique ($\mu$PCD) that is recognized for high speed, whole wafer lifetime mapping capability.

SUMMARY

Methods are disclosed that provide a means for accurate determination of excess carrier lifetime using noncontact carrier decay measurements. Moreover, the methods can be used for accurate determination of the injection level, i.e., the steady-state concentration of excess carriers at which the lifetimes are measured and they can also be used for accurate scanning of lifetime vs. illumination intensities and photogeneration rate and for determining lifetime values at selected illumination intensities such as 1 Sun illumination in the case of silicon wafers for solar cells.

The disclosed methods can benefit many carrier decay lifetime techniques; however the benefits of the disclosed quality of decay control may be realized in techniques that use small excess carrier injection pulses imposed on the substantially larger steady-state carrier generation. Such methods are referred to as "small perturbation measurement" and the corresponding decay lifetime is referred to in literature as small perturbation lifetime or differential lifetime. In some embodiments, the techniques involve small perturbation microwave reflection measured photoconductance decay technique ($\mu$PCD) with a steady-state bias light referred to as quasi-steady-state photoconductance decay, QSS-$\mu$PCD. This technique is used for monitoring of silicon wafers for photovoltaic applications.

In general the excess carrier concentration decay transient is measured after an injection pulse and the decay constant is obtained by fitting the measured data to an exponential time dependence. Ideally, after an initial segment, the decay is exponential and the corresponding decay time constant can be used as a measure of the effective carrier decay lifetime, $\tau_{eff}$, that contains a contribution from the bulk lifetime, $\tau_b$, and from the surface lifetime, $\tau_s$, (the value of $\tau_s$ depends on the surface recombination). Very often however, the measured carrier decay is strongly nonexponential. The fitting cannot be reliably performed and if done, it produces erroneous decay constant and erroneous lifetime values invalidating the lifetime measurement. Furthermore, the common distortions of the carrier decay from exponential dependence vary significantly depending on the properties of semiconductor sample (wafer) and on several experimental variables that define the measurement conditions. Common sample related factors causing such problems include, for example:

(1) trapping of excess carriers by defect centers in semiconductor
(2) dependence of the bulk lifetime and of the surface recombination on the concentration of injected excess carriers;
(3) contribution of nonlinear carrier recombination mechanisms, such as radiative recombination and Auger recombination;
(4) sample conductance change caused by modulation of depletion region by carrier injection.

The trapping and release of trapped excess carriers adds a slow component to the carrier decay and creates long transient tails. A resulting overestimation of the lifetime can be very large (e.g., two orders of magnitude or larger), especially when measurements are done in the low injection range.

Injection dependence of recombination via bulk defects or of the surface recombination can create a progressively faster or progressively slower decay instead of an exponential one. Distortion due to nonlinear radiative recombination and due to Auger recombination can be important in the high injection range used for lifetime measurements in silicon photovoltaics. The interference from depletion region modulation can be important in high resistivity semiconductors and in the low injection range. It can increase the decay constant producing an illusion of long carrier lifetime.

In addition to the above factors, the carrier decay distortions can be created depending on experimental factors such as: (a) the steady-state bias light parameters (intensity, spot diameter); (b) nonlinearity of the signal that measures the concentration of excess carriers; (c) illumination nonuniformity; and/or (d) small laser pulse illumination spot that may lead to carrier concentration decay due to lateral carrier spreading from the excitation area.

To be reliable carrier decay lifetime methods require an exponential decay, therefore wafer and experiment related distortions degrade the reliability of the carrier decay method and can make lifetime measurement practically impossible. Methods are disclosed that recognize and reduce (e.g., eliminate) the carrier decay distortions and define the range of experimental variables that fall within the accurate lifetime measurement multiparameter domain.

In embodiments, the methods feature a decay control that includes three elements: (1) a quantitative measurement of the quality of decay using a quality of decay parameter ("QD"); (2) establishing experimental QD characteristics and corresponding quality of decay control charts with specified QD limits close to the ideal decay value, QD=1; and (3) defining accurate lifetime measurement multiparameter domain and performing the excess carrier lifetime measurements with a carrier decay method in this domain.

In some embodiments, the quality of decay parameter QD is obtained as a ratio of consecutive time increments in a progressing carrier decay, whereby, the time increments correspond to a drop of the decay signal by a constant factor, C. For an ideal exponential decay, such time increments remain the same throughout the entire decay and thus QD=1. The quality of decay, QD, different than 1, identifies progressive distortion in the carrier decay as compared to an ideal exponential transient needed for reliable lifetime determination.

In such embodiments, QD<1 identifies measurements leading to erroneous underestimation of lifetime caused by a progressively faster decay, such as the effect of injection level dependence of recombination (factor 2), while QD>1 identifies an overestimation of lifetime caused by a progressively slowing decay, such as trapping related (factor 1), or space charge modulation (factor 4).

In certain embodiments, the methods feature determining QD parameter using as the factor C any number that is sufficiently larger than 1; for example 1.5, 2.0, 2.5 or 3.0 or more. Selection of a smaller number for C will result in time increments, $\Delta t$, smaller than those corresponding to larger C. Therefore smaller C gives higher decay probing density than large C. On the other hand smaller C corresponds to a smaller drop in decay signal magnitude and it may result in less precise determination of the QD parameter. The specific value of C in a given measurement can be selected considering the optimal condition for measurement. In some embodiments, C=2 can be used. This value for C can offer a compromise between decay probing density and the accuracy of the QD determination. The time increment corresponding to C=2 is the time required for a decay signal to fall to half its value. It is referred to as "half-life" ($\tau_{1/2}$) and it is commonly used in physics to describe a property of radioactive decay, which follows an exponential decay.

In this disclosure, the half-life, $\tau_{1/2}$, and the QD calculated using the ratio of half-life values are used in examples illustrating the method and the properties of photoconductance decay including typical distortions deviating from an exponential decay.

Quality of decay control can also be used for tuning the measuring apparatus to assure a linear response of measured signals to the excess carrier concentration. For a microwave detected photoconductance decay, such tuning can be used to optimize the linear response of the reflected microwave power. It can also be used to optimize steady-state and pulsed laser illumination intensities, the light beams and the microwave spot geometrics, and frequency.

In certain aspects, the disclosed methods relate to creating a close to ideal exponential carrier decay measurement condition and to accurate parameter-free measuring of the carrier decay lifetime, directly from the exponential decay time constant. The methods further relate to measuring such a decay lifetime over a range of steady light intensities (provided by the steady bias light) and to using decay lifetime for accurate determination of the corresponding steady-state lifetime values and the steady-state injection levels. With quality of decay control and operation within quality of decay limits, the parameters important for evaluation of the silicon photovoltaic structures can be obtained from measured lifetime characteristics such as the bulk lifetime, $\tau_b$, the surface recombination, the emitter saturation current, $J_0$, and the implied open circuit voltage, implied $V_{oc}$.

The disclosed accurate measuring of carrier lifetime does not, in general, require any semiconductor sample parameters. Therefore it can be used as a bench mark for comparing different lifetime measurements and can provide a means for quantitative calibration of other indirect methods such as, for instance, photoluminescence lifetime imaging or quasi-steady-state photoconductance method, QSSPC:

In summary, embodiments rely on using any combination of three elements defined as follows:

(1) Quality of decay parameter, QD; that is defined as a ratio of consecutive time increments in a progressing carrier decay where a time increment is the time required for a decay signal to drop by a constant factor C. The ratio of the following to the preceding time increment is used. However, it shall be apparent that the inverse ratio can also be used with the only difference that the properties of QD<1 and QD>1 shall be reversed in such a case.

(2) Quality of decay control chart: is the chart that presents QD values vs. a given experimental variable and marks lower and upper QD control limits, "LCL" and "UCL", respectively. The QD values between the control limits correspond to deviation from exponential decay sufficiently small for accurate lifetime determination. An acceptable deviation is determined by the selected values of the control limit, for example, measurements within limits of $1-\Delta$ and $1+\Delta$, respectively. The $\Delta$ determines a maximum relative deviation of the lifetime from measured decay as compared to an ideal exponential decay.

(3) The accurate lifetime measurement domain is given by a range of experimental variables corresponding to QD within the control limits. The accurate lifetime measurement domain is determined from QD control chart corresponding to a given experimental parameter. The set of domains for different parameters represents the "multi-parameter domain". The accuracy of the measurement within the domain depends on the specified control limits.

Various aspects of the invention are summarized as follows.

In general, in one aspect, the invention features a method that includes exciting excess carriers in a semiconductor sample; after termination of the excitation, measuring a decay of the excess carriers; determining a quality of decay parameter in a progressing excess carrier decay; and determining an excess carrier lifetime for the semiconductor sample based on a measured decay where the quality of decay parameter value is within predetermined quality of decay control limits indicative of an accurate excess carrier lifetime measurement. Implementations of the method can include one or more of the following features and/or feature of other aspects. For example, the predetermined quality of decay control limits can correspond to the quality of decay value being at or close to one. The decays can be measured using a non-contact measurement method. The decays can be measured using microwave detected photoconductance, radio-frequency inductive coupling, photoluminescence, or free carrier absorption.

An excess carrier decay can be generated in the semiconductor sample using a short laser pulse imposed on a steady-state illumination that generates a steady-state concentration of excess carriers in the semiconductor sample, and the decay is measured in steps corresponding to changes in the steady-state illumination intensity. Determining the accurate excess carrier lifetime can include determining a variation in the quality of decay value as a function of the steady-state light intensity and establishing a range of steady-state light intensities for which the quality of decay is within the predetermined range indicative of an accurate excess carrier lifetime measurement. The excess carrier lifetime can be determined based on one of the decay measurements acquired within the range of steady-state light intensities for which the quality of decay is within the predetermined range indicative of an accurate excess carrier lifetime measurement. The excess carrier lifetime and quality of decay value can be determined based on a portion of the decay measurement. In certain embodiments, the excess carrier decay is generated by short a light pulse. The light pulse can be a laser pulse and the conditions can be adjusted by changing the pulse laser power until QD is within predetermined control limits.

In another aspect of the invention, the excess carrier lifetime can be determined based on the decay measurement acquired for a highest power of the laser pulse that yields a quality of decay within the predetermined range indicative of an accurate excess carrier lifetime measurement.

In another aspect, the invention features a method for calibrating a semiconductor measuring apparatus, including performing one or more excess carrier lifetime measurements using the method of the foregoing aspect for a test sample while varying at least one measurement parameter of the semiconductor measuring apparatus across a range for which the test sample is known to have a quality of decay within the predetermined range; and calibrating the measuring apparatus based on the excess carrier lifetime measurements. In some embodiments, the measuring apparatus is a microwave detected photoconductance apparatus.

Implementations of the method can include one or more of the features discussed above.

The details of one or more embodiments of the invention are set forth in the accompanying drawings and the description below. Other features and advantages will be apparent from the description and drawings, and from the claim.

BRIEF DESCRIPTION OF THE DRAWINGS

FIG. 3A presents the decay in a linear scale fitted to an exponential curve; and FIG. 3B presents the decay in a semilogarithmic scale fitted to an exponential decay.

FIG. 4A presents the measured decay curve in a linear scale together with the exponential curve that represents the best fit; and FIG. 4B presents the measured decay curve in a semilogarithmic scale together with the curve representing the best fit to the exponential decay.

FIG. 8A illustrates behavior for the wafer in FIG. 6A, while FIG. 8B illustrates behavior for the wafer in FIG. 6B. Accurate lifetime measurement domains for steady-state light intensity are also indicated in FIG. 8A and FIG. 8B.

DETAILED DESCRIPTION

The measurement of excess carrier lifetime from a carrier decay transient can be done with different methods used to detect the change in carrier concentration. Such detection can be done using noncontact methods involving microwave reflection or transmission, radio-frequency inductive coupling, photoluminescence or free carrier adsorption. Among them the most commonly used is the microwave-detected photoconductance decay (μPCD) technique that detects the carrier decay by measuring the power of microwave signal reflected by the wafer. Examples of the μPCD systems are described in the following references: Paul A. Basore and Barry R. Hansen, "Microwave-Detected Photoconductance Decay", 21st IEEE Photovoltaic Specialist Conf., p. 374-379, Kissimmee, Fla. 1990; Martin Schofthaler and Rolf Brendel, "Sensitivity and Transient Response of Microwave Reflection Measurements", J. Appl. Phys. 77 (7), 1 Apr. 1995, pp. 3126-3173; Armin G. Aberle and Jan Schmidt, "On the Data Analysis of bias light Photoconductance Decay Measurements", J. Appl. Phys. 79 (3), 1 Feb. 1996, pp. 1491-1496; Daniel Macdonald, Ronald A. Sinton, and Andres Cuevas, "On the Use of a bias light Correction for Trapping Effects in Photoconductance-based Lifetime Measurements of Silicon", J. Appl. Phys., Vol. 89, No. 5, 1 Mar. 2001, pp. 2772-2778; P. J. Cousins, D. H. Neuhaus, and J. E. Cotter, "Experimental verification of the effect of depletion-region modulation on photoconductance lifetime measurements", J. Appl. Phys., Vol. 95, no. 4, Feb. 15, 2004, pp. 1854-1858; and K. Lauer, A. Laades, H. Ubensee, H. Metzner, and A. Lawerenz, "Detailed Analysis of the Microwave-detected Photoconductance Decay in Crystalline Silicon", J. Appl. Phys. 104, (2008), pp. 104503-1-104503-9; Marshall Wilson, Jacek Lagowksi, Piotr Edelman, Alexandre Savtchouk, Andrew Findlay, Sara Olibet and Valentin Mihailetchi, "Unified Lifetime Measurement for Silicon PV", Proceedings of the 38th IEEE PVSC Austin, Tex. Jun. 3-8, 2012; Marshall Wilson, Piotr Edelman, Jacek Lagowski, Sara Olibet and Valentin Mihailetchi, "Improved QSS-µPCD Measurement with Quality of Decay Control: Correlation with Steady-State Carrier Lifetime", Solar Energy Materials and Solar Cells 106 (2012) 66-70.

Figure 1:
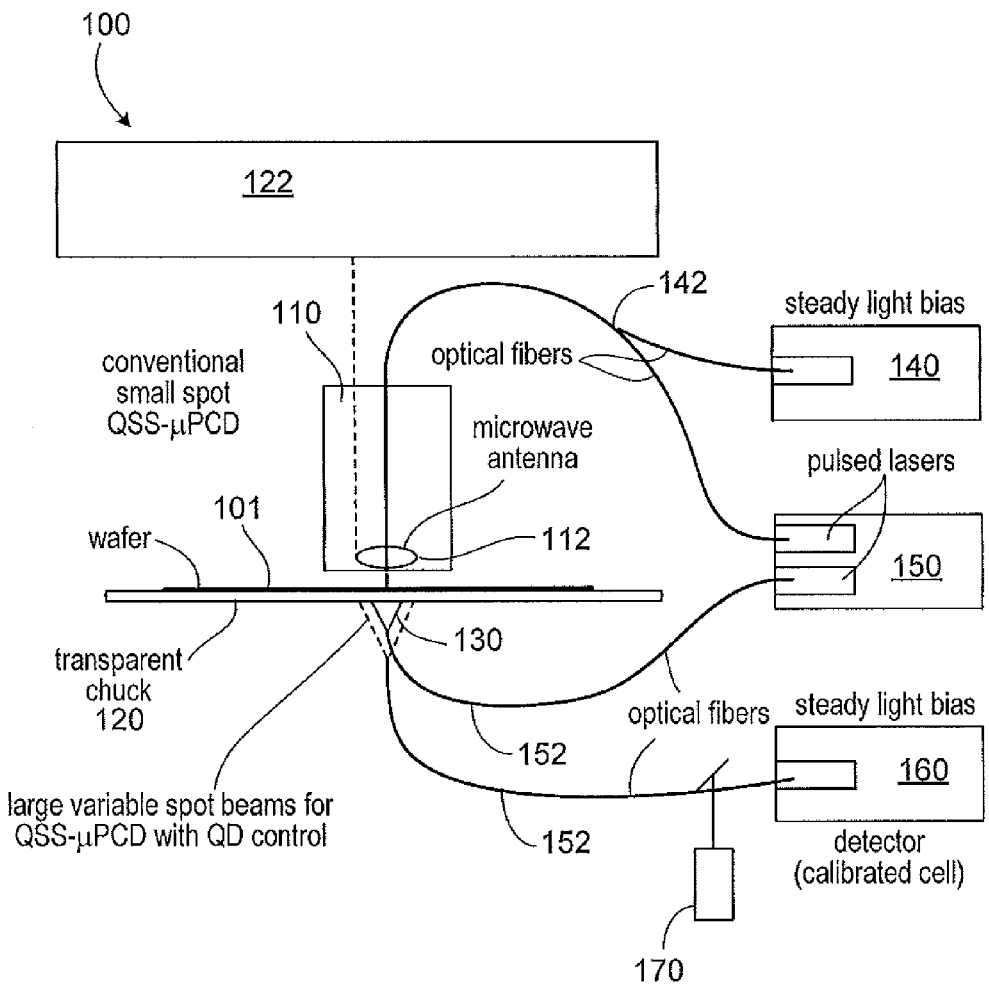
FIG. 1 is an example of a carrier decay measuring arrangement that uses microwave reflection to detect the photoconductance decay after a laser pulse excitation on the background of steady-state bias light.

FIG. 1 shows an embodiments of a system 100 configured to perform a technique referred to as quasi-steady-state µPCD, QSS-µPCD. System 100 includes a µPCD head 110, a transparent wafer chuck 120, a reflected microwave monitoring module 122 and a series of light sources including two steady light bias sources 140 and 160, and two pulsed lasers 150. Optical fibers 142 deliver light from light bias source 140 and one of pulsed lasers 150 to a common location on the top surface of wafer 101, while optical fibers 152 deliver light from light bias source 160 and the other pulsed laser 150 to a common location the bottom surface of wafer 101. Fibers 142 and 152 allow for variable spot beam size 130 at the wafer 101. System 100 also includes a detector 170 that receives light from light bias source 160, which allows for calibration for system 100.

The microwave is emitted from the µPCD head 110; it is reflected back by the wafer 101 and detected by a ring-shaped antenna 112 in head 110. Antenna 112 is in communication with module 122, which monitors reflected microwaves. The microwave frequency can be tunable in the range from 10.0 GHz to 10.5 GHz, for example. An additional reflector plate (no shown) beneath the wafer is used to stabilize and to optimize the reflected microwave. To measure the photoconductance, the system operates in a linear response range, whereby the microwave reflection signal (typically dc-voltage signal) is proportional to a change in carrier concentration in the measured sample induced by a laser pulse from either or both of pulsed lasers 150. The decay measurements can be done recording a single laser pulse induced decay. In practice, multiple laser induced decays are recorded at the same condition and they are averaged enhancing sensitivity and signal to noise ratio.

A typical µPCD system averages up to thousands of decays for a single lifetime determination. A short laser pulse typically used has about a 200 ns duration and 20 ns turn-off time. For measurement of silicon, a laser with a wavelength of about 900 nm can be used. Other wavelengths can also be used providing that the corresponding energy of photons is larger than the silicon energy gap (i.e., hv>1.12 eV). The laser beam spot can be as small as 1 mm in diameter and as large as about 10 mm in diameter. The large spot illumination in FIG. 1 is realized from the back-side. Typically the laser power can be adjusted to give from about 1e10 to 2e13 photons in a pulse.

The system in FIG. 1 includes a steady-state bias light source 160 that illuminates a wafer area larger than the pulsed laser spot and sufficiently large to avoid injected carrier non-uniformity caused by lateral diffusion and carrier spreading from the illuminated area. The practically used steady-state illumination spot diameter can vary from 3 mm to about 15 mm. The steady-state light intensity, I, is adjustable and covers the range from 0 to about 20 suns (i.e., to about 2,000 mW/cm$^2$) or higher. The 1 sun intensity (100 mW/cm$^2$) is often used in lifetime measurement of wafers for photovoltaic applications, because it corresponds to solar cell working conditions. An example of the steady-state bias light illumination sources used for QSS-µPCD measurements in silicon include (1) a small spot (e.g., 2 mm diameter) front side halogen light illumination through an optical fiber; the spectrum can be adjusted using IR filters and intensities can be varied with neutral density filters, iris or supply current to the halogen bulb, (2) variable large spot (e.g., up to 15 mm) continuous LED or laser beam illumination from the back side of the wafer with intensity varied by the power supply; the beam can be directed on the wafer from the front or from the back using an optical fiber, an example wavelength could be 980 nm.

The illumination intensity of the steady-state bias light can be measured in-situ or it can be precalibrated. In-situ measurement or precalibration can be done with a calibrated detector (for instance, a calibrated silicon solar cell can be used as a detector). In the present disclosure, the µPCD apparatus used as an example has steady-state bias light intensities up to about 20 suns. Laser pulse 1 mm spot illumination is provided from the front and variable large spot laser pulse illumination up to 12 mm in diameter, as shown in FIG. 1 from the wafer back side, opposite to the microwave head.

Figure 2:
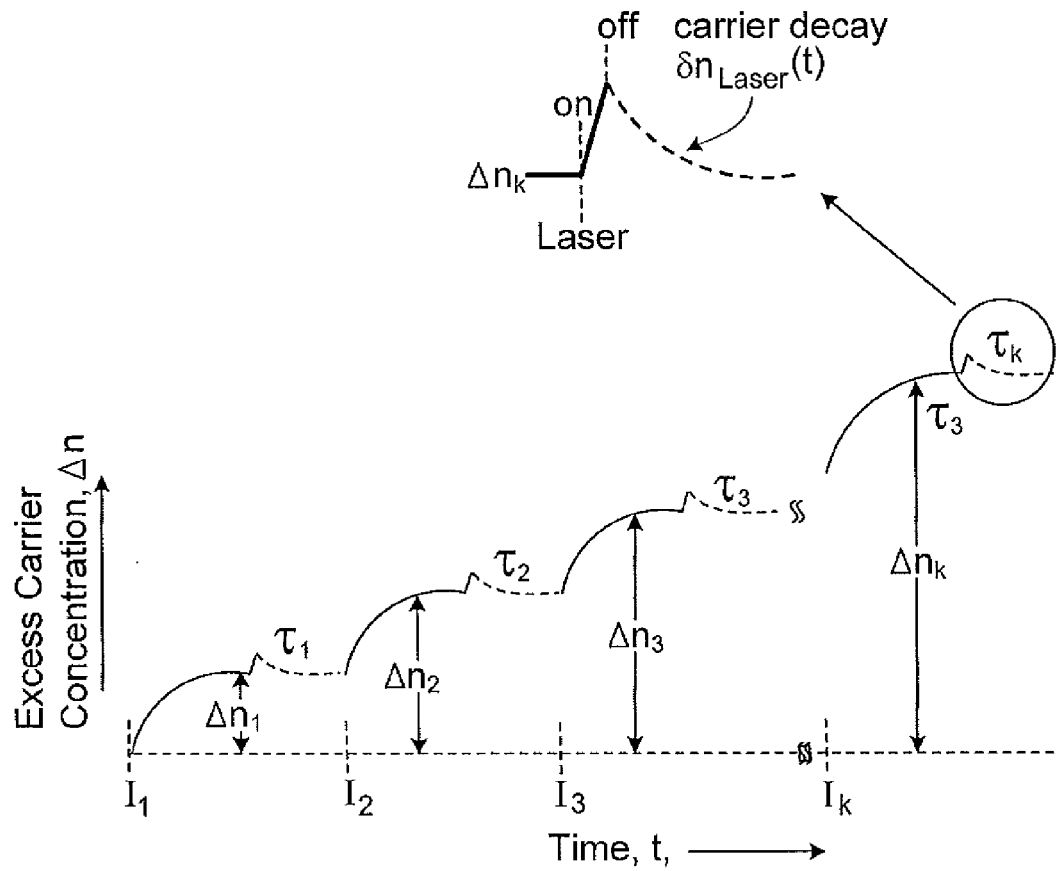
FIG. 2 is an illustration of the small perturbation excess carrier decay measurements that use small magnitude excess carrier laser injection imposed on a much larger steady-state carrier concentration generated by bias light. Encircled is the illustration of the laser induced carrier concentration decay.

In QSS-µPCD with bias light, the carrier lifetime is determined from the decay of carrier concentration, $\delta n_{Laser}(t)$, after the short laser pulse excitation applied when steady-state condition is reached, (as shown in FIG. 2). The laser pulse generates excess carriers in addition to steady-state bias light generation that establishes the background steady-state excess carrier concentration, $\Delta n$ ($\Delta n$ is also referred to as the steady-state injection level). Laser pulse injected excess carriers $\delta n_{Laser}$ add to that value and after laser pulse termination, $\delta n_{Laser}$ decays with time to zero.

The measurements are carried out under a "small perturbation" condition. The laser injected excess carrier concentration values, $\delta n_{Laser}$, are small perturbations with respect to the background carrier concentration, $\Delta n$, produced by the bias light. To achieve such a condition, the laser pulse power shall be at a sufficiently low level. Alternatively, the laser beam can be defocused to illuminate a larger diameter spot providing reduced photon flux at the same laser power. In the µPCD technique, the latter one typically gives better signal to noise ratio, while a small beam diameter can be used for higher resolution mapping. The quality of decay control method allows for the optimization of the measurement and the achievement of the "small perturbation" condition leading to an exponential carrier decay, $\delta n_{Laser} \exp(-t/\tau_{eff})$, illustrated in FIG. 2, whereby the decay time constant is the effective carrier decay lifetime, $\tau_{eff}$.

In general, the effective decay lifetime measured on the background of the steady bias light is a differential lifetime that can differ in value from the effective steady-state lifetime.

Reliable determination of the excess carrier decay lifetime with carrier decay techniques can be done when the carrier decay is exponential or at least when it contains a well-defined exponential segment. The corresponding methods based on microwave reflectance measurements on silicon are described in ASTM F1535-94, and more recently in SEMI MF 1535 and SEMI PV9-1110 (the entire contents each of which are incorporated herein by reference). As described in these standards and also in extensive published literature, the initial part of carrier decay is typically rejected in the lifetime measurement. It is affected by excess carrier concentration change due to carrier spreading across the wafer thickness due to diffusion. This process would interfere with monitoring of the recombination lifetime. After that initial diffusion transient time of about $W^2/2D$ (W is the wafer thickness and D is the carrier diffusivity), the carrier profile across the wafer thickness is established and the decay can follow the primary mode of decay, whereby, the concentration decreases due to recombination in the bulk of the wafer (that is characterized by the bulk lifetime, $\tau_b$) and due to recombination at the surfaces. The latter recombination is characterized by the surface lifetime, $\tau_s$. In a simple case, although often not the most reliable case, when the recombination parameter in the bulk and at the surface is independent of the injection level, the carrier decay is exponential and the primary mode decay time constant equals the carrier effective lifetime, $\tau_{eff}$, which contains the bulk and surface contributions $$\frac{1}{\tau_{eff}} = \frac{1}{\tau_b} + \frac{1}{\tau_s} \qquad (1)$$

For silicon wafers with passivated surfaces, used as an example in the present disclosure, the $\tau_s$ can be approximated as $$\frac{1}{\tau_s} = \frac{2S}{W}$$

that gives the effective lifetime $$\frac{1}{\tau_{eff}} = \frac{1}{\tau_b} + \frac{2S}{W} \qquad (2)$$

where S is the surface recombination velocity and W is the wafer thickness.

When two wafer surfaces are different, 2S shall be replaced by $S_f+S_b$ ($S_f$ corresponds to front surface and $S_b$ to back surface). In photovoltaic structures containing emitters, the surface recombination term in eqn. 2 shall be replaced by an equivalent term containing the emitter saturation current, $J_0$. Therefore, measurement of $\tau_{eff}$ enables to determine $J_0$. The above equations 1 and 2 describe a one dimensional case that ignores the effects of lateral carrier diffusion away from the illumination spot.

Figure 3A:
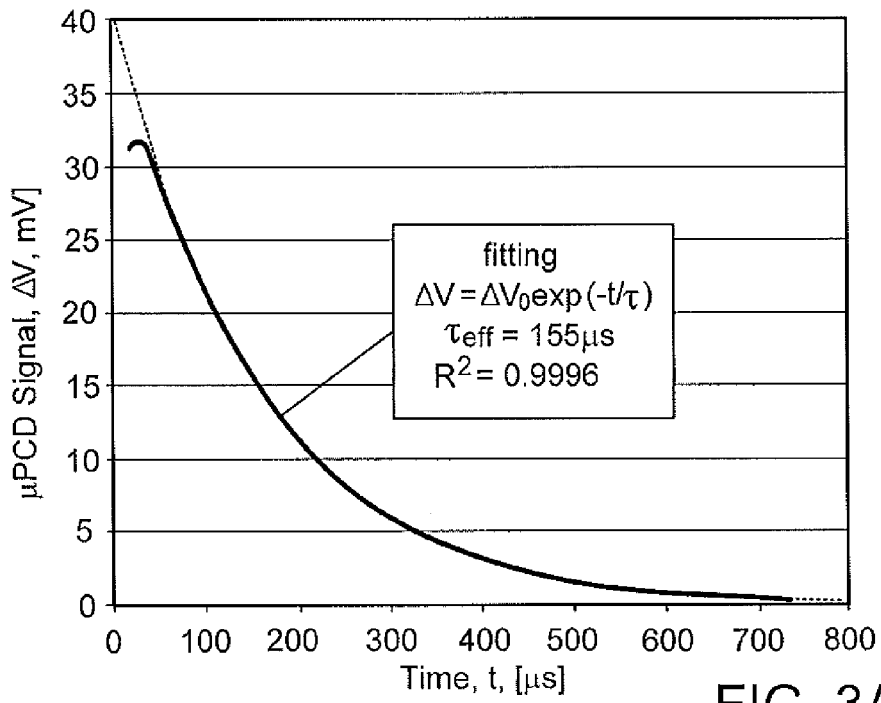
FIGS. 3A and 3B are plots showing examples of an ideal carrier decay measured with reflected microwave photoconductance on a silicon wafer and is achieved after setting of the measurement according to quality of decay control conditions.
Figure 3B:
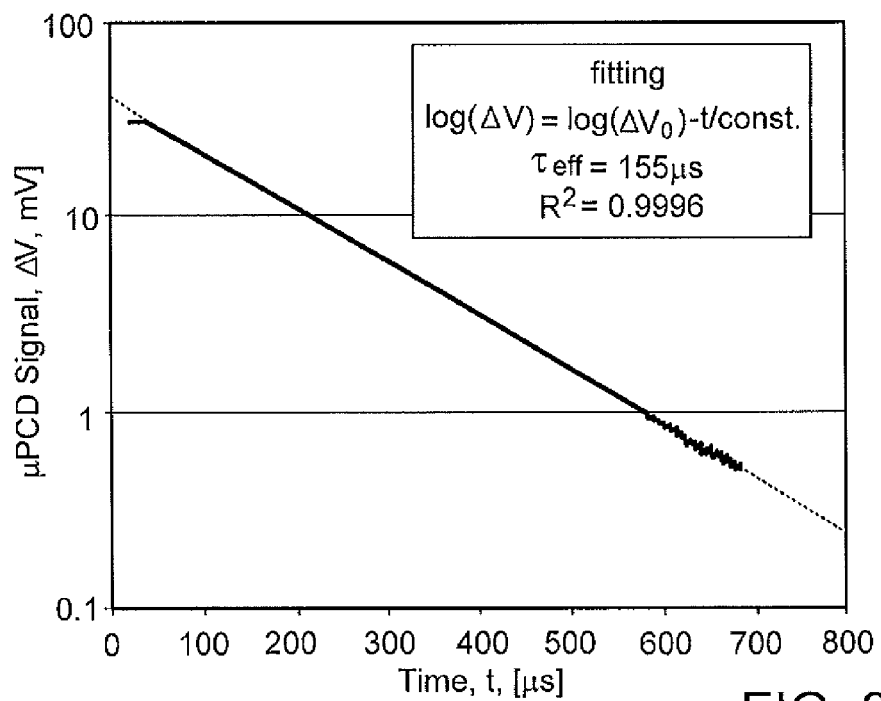

The disclosed methods address how to improve lifetime measurements in very frequent cases when carrier decay tends to be nonexponential, including interferences caused by wafer related injection level effects and also by lateral carrier spreading from excitation spot and by other measurement related factors. Describing the procedure, we start with an ideal case. An example of ideal carrier decay is illustrated in FIGS. 3A and 3B with the results of µPCD measurement on n-type silicon wafer with passivated surfaces. FIG. 3A presents the decay in a linear $\Delta V$ vs. time scale. This decay curve can be fitted very well to an exponential transient:

$$\Delta V = \Delta V_o \exp(-t/\tau_{eff}) \qquad (3)$$

The experimental data and the fitted curve coincide with the exception of the short initial fragment. The fitting with a correlation $R^2=0.9996$, gives the effective lifetime, $\tau_{eff}=155$ µs.

However, the same data, as that in FIG. 3A, presented in an often used logarithmic scale log $\Delta V$ vs. time, are given in FIG. 3B. These results fit very well to a dependence obtained by taking the logarithm of eqn. 3.

$$\log \Delta V = \log \Delta V_o - t/\text{const} \qquad (4)$$

$$\text{const} = \tau_{eff}/\log e$$

Fitting gives $R^2=0.9996$ and the effective lifetime, $\tau_{eff}=155$ µs.

Figure 4A:
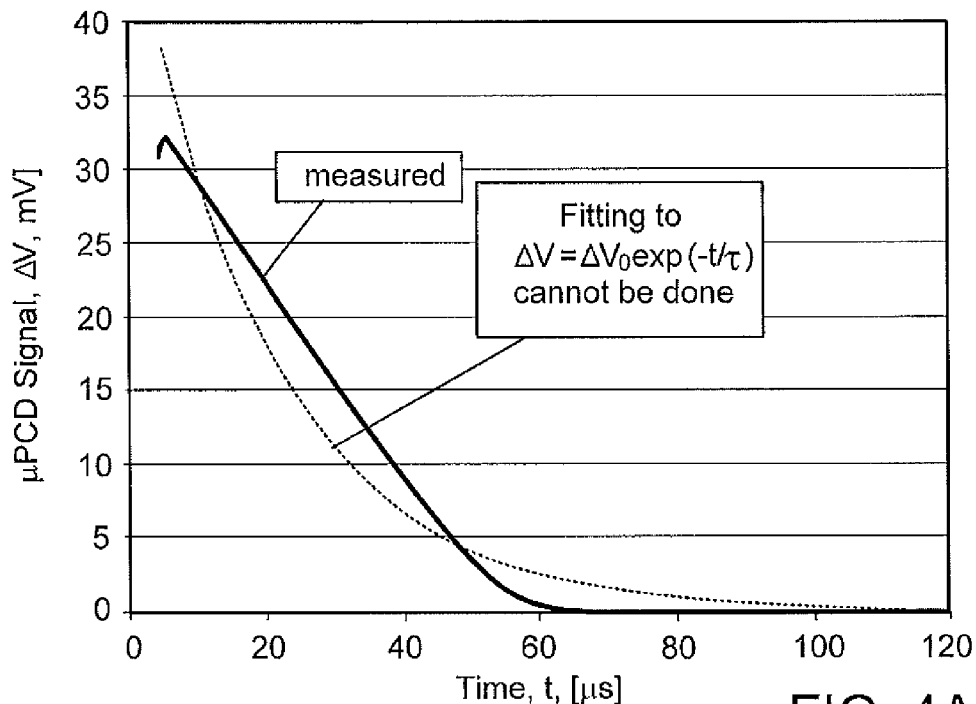
FIGS. 4A and 4B are plots showing examples of a carrier decay measured with reflected microwave photoconductance on the same silicon wafer as in FIG. 3, without the condition setting of the measurement with quality of decay controls.
Figure 4B:
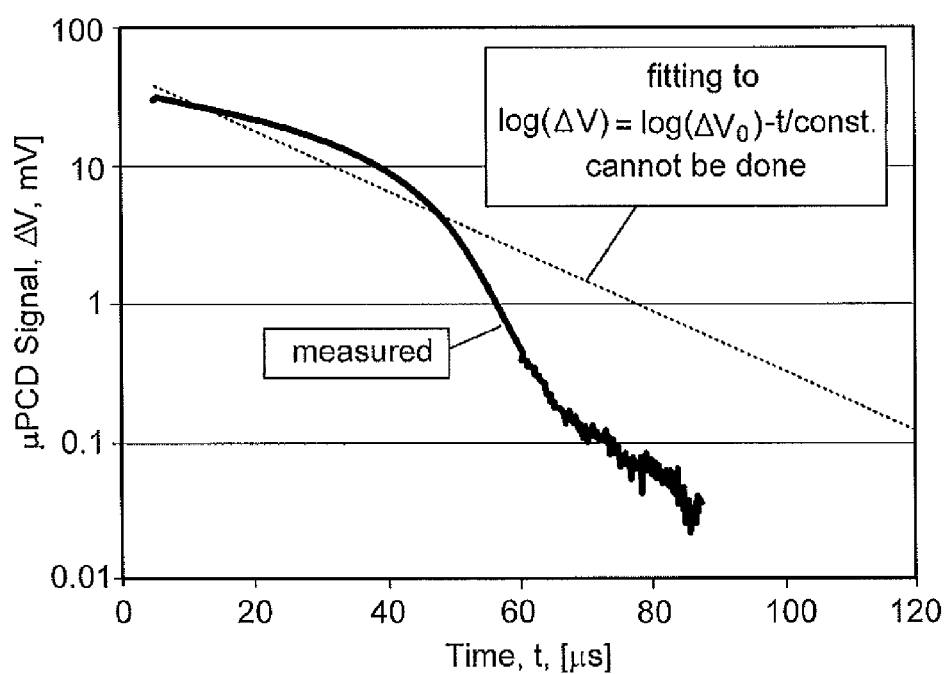

By adjusting the microwave frequency to operate in a linear µPCD signal range, $\Delta V$, is proportional to $\Delta n_{Laser}$. Therefore the µPCD signal decay $\Delta V(t)$ can be used as representing the decay of excess carriers $\Delta n_{Laser}(t)$ The practically ideal exponential carrier decay shown in FIG. 3A and FIG. 3B using $\Delta V$ for the linear and logarithmic scale, respectively, was achieved by adjusting the measuring conditions until QD=1.00±0.02 was obtained. This optimum condition corresponded to a steady bias light spot diameter of 15 mm, and intensity of 2 suns and a laser pulse dose of 20e11 photons in a beam 10 mm in diameter. The results of measurements done on the same wafer and the same site, however, under a different not optimized condition that was giving a quality of decay parameter of 0.58, i.e. outside the accurate lifetime measurement range, are shown in FIG. 4A and FIG. 4B in a linear and logarithmic scale, respectively. It is seen in these figures that the decay of $\Delta V$ measured under such conditions, cannot be fitted to an exponential decay. Therefore, the excess carrier lifetime cannot be determined from the measurement under this condition. The corresponding quality of decay parameter to this bad measurement condition in FIGS. 4A and 4B was QD=0.58, and is too far from the desired QD control limits of 1±0.05. Specific illumination conditions corresponding to these results were a steady-state bias light spot of 2 mm, an intensity of 0.2 suns and a laser pulse dose of 20e11 photons and in a beam 1 mm in diameter.

Figure 5:
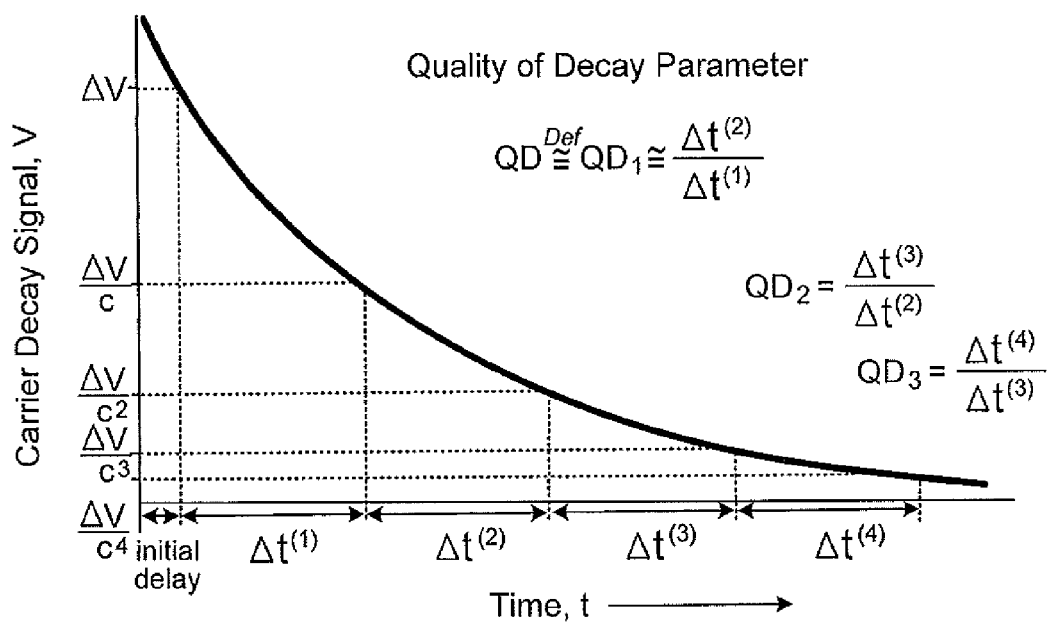
FIG. 5 is an illustration of the determination of the quality of decay parameter, QD.

According to the disclosed method, the decay quality analysis evaluates the decay using the quality of decay parameter, QD that is measured as illustrated in FIG. 5. Measurement of QD starts after a short delay from termination of the laser pulse in which a decay signal $\Delta V$ drops by a constant factor C. This factor is selectable (example shown in FIG. 5 uses C=1.75).

In reference to FIG. 5, the quality of decay parameter can be described as follows. $\Delta V$ is the signal value on the µPCD decay curve after a preset delay time from the laser pulse turn-off moment.

In practice, a delay until the decaying signal drops about 20% from its maximum is sufficient. Starting from that moment, the QD is determined as a ratio of successive time segments, $\Delta t$. The first time segment, $\Delta t^{(1)}$, is the time period in which the signal is reduced from $\Delta V$ to $\Delta V/C$. Then the second time, $\Delta t^{(2)}$ is the time period in which the signal is reduced from $\Delta V/C$ to $\Delta V/C^2$ ... and so on. Then the n-th time segment $\Delta t^{(n)}$ corresponds to the signal reduction from $\Delta V/C^n$ to $\Delta V/C^{n+1}$. The quality of decay is defined as the ratio between the second and the first segment:

$$QD \stackrel{Def}{=} \frac{\Delta t^{(2)}}{\Delta t^{(1)}} \qquad (5)$$

The quality of decay analysis can be applied to further stages of the decay, using for example, $QD_2$ given by $\Delta t^{(3)}$ to $\Delta t^{(2)}$ ratio; or $QD_3$ given by $\Delta t^{(4)}$ to $\Delta t^{(3)}$ ratio ..., and $QD_n$ given by $\Delta t^{(n+1)}$ to $\Delta t^{(n)}$ ratio:

$$QD_n \stackrel{Def}{=} \frac{\Delta t^{(n+1)}}{\Delta t^{(n)}} \qquad (6)$$

The very first parameter, $QD_1$ is most often used. In this case, the subscript 1 can be omitted for simplicity.

QD is a very powerful parameter in the evaluation of carrier decay. Ideally, QD equals 1 and remains 1 through the further stages of the decay. (This is a property of an ideal exponential decay, whereby, the time segment remains constant throughout an entire decay and $\Delta t = \tau_{eff}$ in C.)

In some embodiments, the methods future determination of QD parameter using as the factor C any number that is sufficiently larger than 1; for example 1.5, 2.0, 2.5, or 3.0. Selection of a smaller number for C will result in time increments Δt smaller than those corresponding to larger C. Therefore smaller C gives higher decay probing density than large C. On the other hand smaller C corresponds to a smaller drop in decay signal magnitude and it may result in less precise determination of the QD parameter. The specific value of C in a given measurement can be selected considering the optimal condition for measurement. In some embodiments C=2 can be used that offers a compromise between decay probing density and the accuracy of the QD determination. The time increment corresponding to C=2 is the time required for a decay signal to fall to half its value. It is referred to as "half-life" (TO and it is used in physics to describe a property of radioactive decay, which follows an exponential decay.

For results shown in FIGS. 3A and 3B, QD=1.00±0.02 and the decay was very close to an ideal exponential decay. For results shown in FIGS. 4A and 4B, the quality of decay parameter was only QD=0.58, and the decay was strongly nonexponential.

Figure 6A:
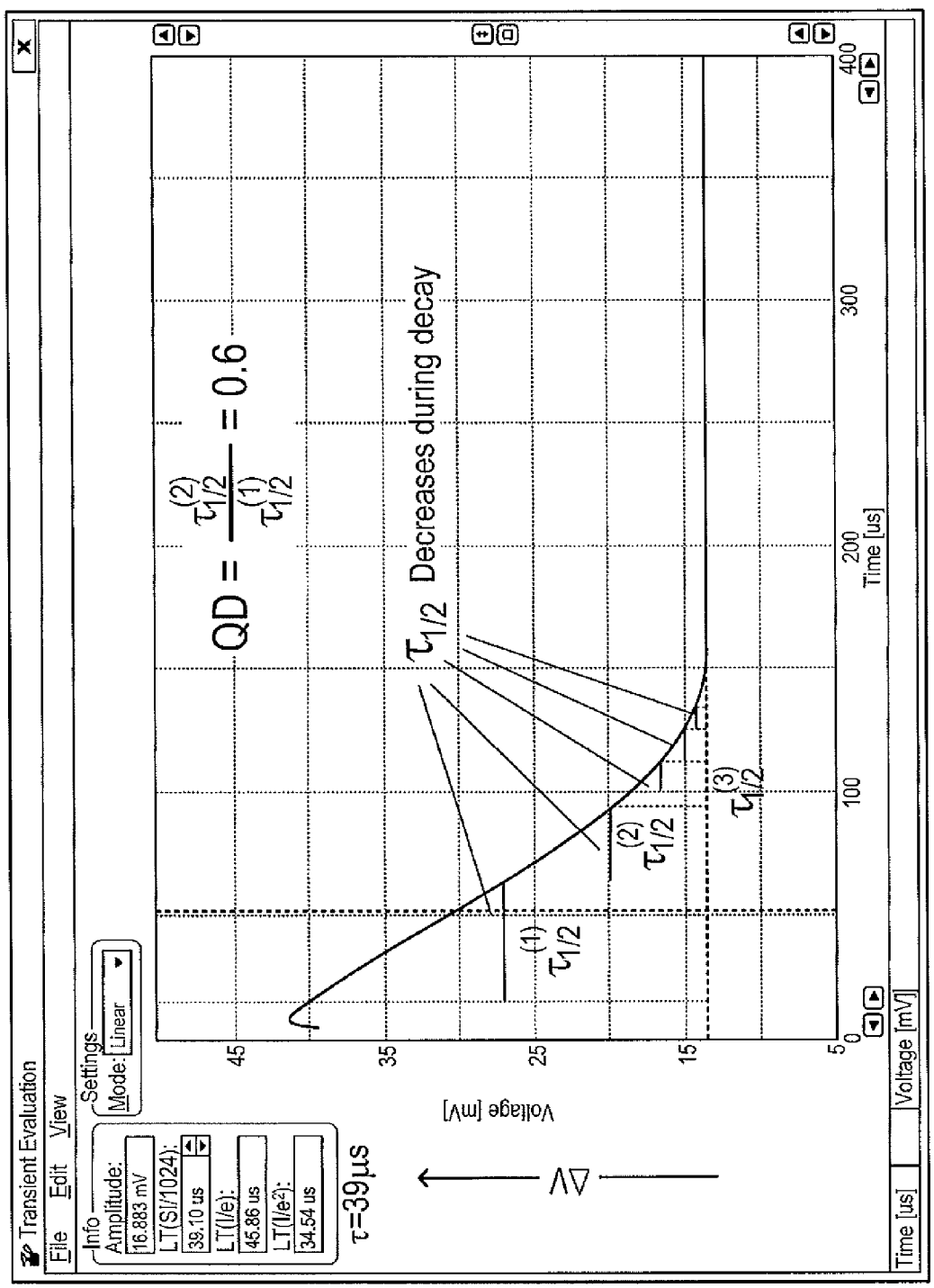
FIGS. 6A and 6B are plots illustrating two different cases of nonexponential carrier decays that are distinguished by a quality of decay parameter value lower than 1 and larger than 1, as shown in FIGS. 6A, and 6B respectively. For illustration purposes half-life $\tau\frac{1}{2}$ is used for QD determination and for showing decay distortions from nonexponential decay.
Figure 6B:
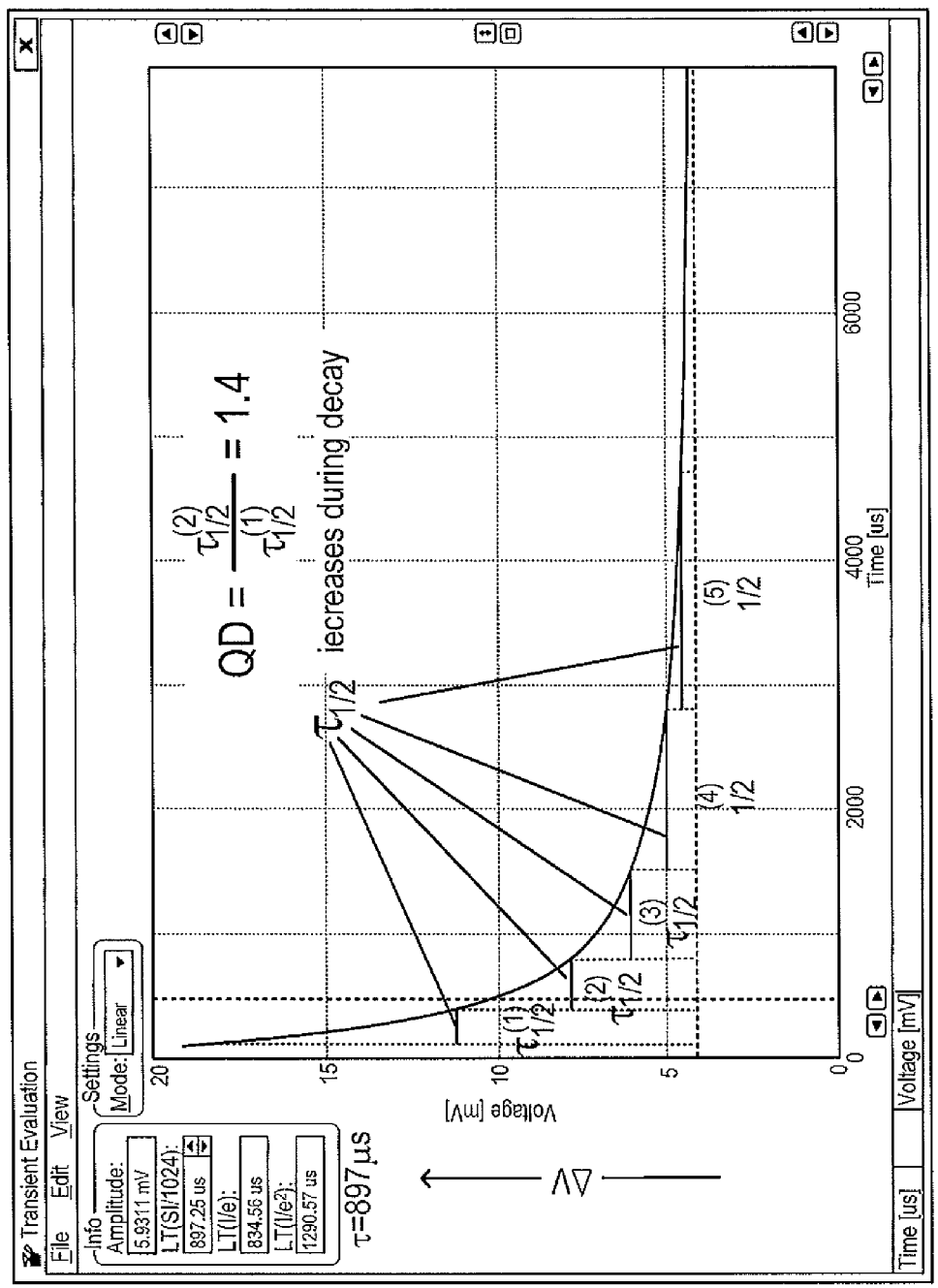

Two different cases that represent typical carrier decay problems are illustrated in FIGS. 6A and 6B. They are distinguished by QD values lower than one, and larger than one as shown in FIG. 6A and in FIG. 6B, respectively.

The decay in FIG. 6A is similar to the nonexponential transient in FIGS. 4A and 4B that corresponds to decreasing of half-life with a progressing decay. In experimental results presented in this application (FIG. 6, FIG. 8, FIG. 10) C=2 is used as an example and the time interval was the half-life. The quality of decay parameter value identifies this problem, showing QD<1.

The decay in FIG. 6B illustrates opposite behavior, i.e., the increase of half-life with progressing decay. This is a typical consequence of the trapping of excess minority carriers. It is referred to as the problem factor (1) in the summary section. The trapped carriers are slowly released from carrier trapping centers. They contribute to photoconductance signal only after release from traps. This effect results in long decay tails manifested by $\tau_{1/2}$ increasing during decay. The quality of decay value, QD>1 identifies this problem.

Figure 7:
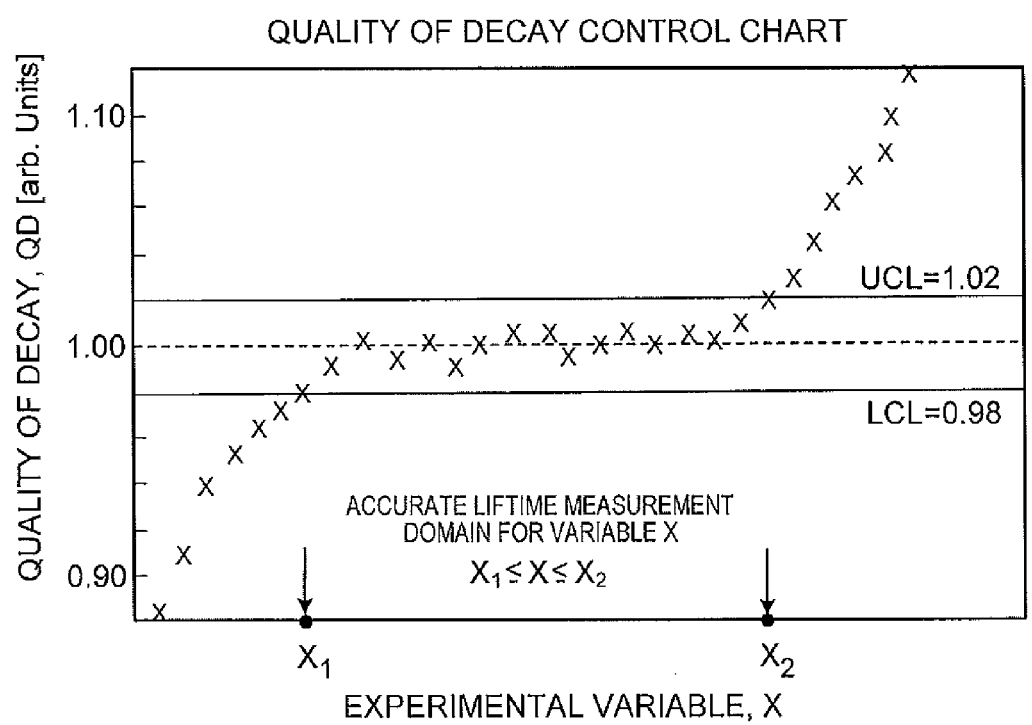
FIG. 7 is an illustration of the quality of decay control chart, QD parameter dependence on the experimental variable. QD values between the lower and the upper control limits (UCL and LCL, respectively) define the accurate lifetime measurement domain for the variable X.

Identification of the carrier decay problems by measuring QD is one aspect of the present disclosure. Another aspect relates to the decay quality control that establishes a range of desired experimental conditions, based on measured QD characteristics and to establishing an accurate lifetime measurement domain for experimental variables and apparatus parameters. These variables include, but are not limited to the following: (1) steady bias light intensity and the size of the beam spot; (2) photon dose in a laser pulse and the size of laser beam spot; (3) the wavelength of bias light and the wavelength of the pulsed laser; (4) the size of excess carrier detection area (related to size of microwave antenna); (5) microwave frequency; and (6) the resistivity of semiconductor samples. To establish the domain, the decay is measured for different values of a given variable. The QD parameter is determined for each value and its measured characteristics are adjusted using the quality of decay control chart, as illustrated in FIG. 7. In this illustrating chart, x represents any pertinent experimental variable. The control chart incorporates the limits for QD values, the upper control limit UCL, with the prescribed value above 1 and the lower control limit LCL, with the prescribed value below 1. The x values for QD within the limits, represents the accurate lifetime measurement domain for this variable.

Figure 8A:
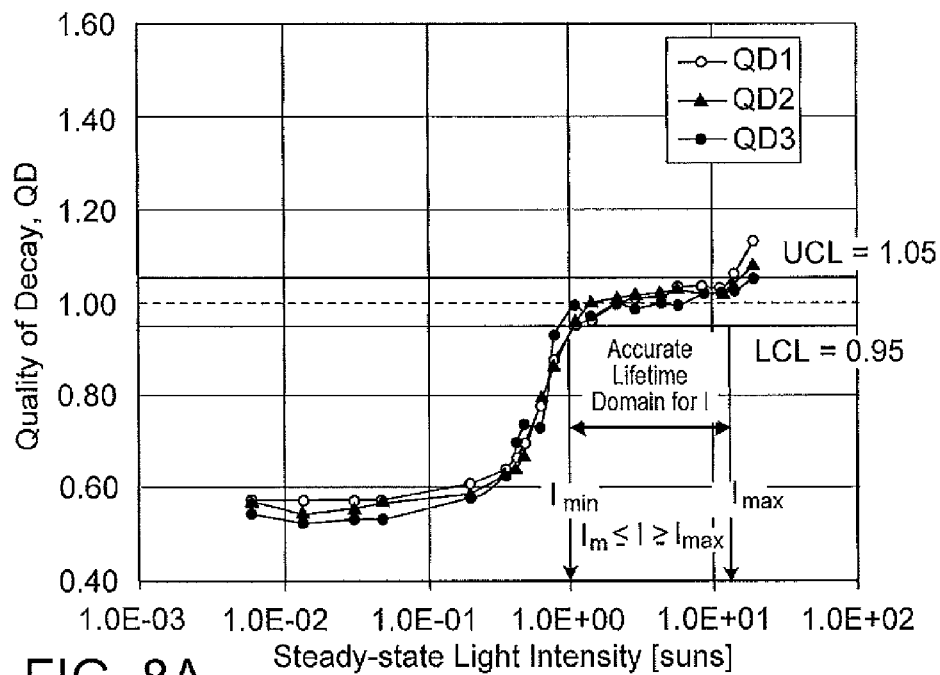
FIGS. 8A and 8B are plots illustrating quality of decay control chart based on measurements of QD vs. steady-state light intensity (i.e. bias light intensity).

For silicon photovoltaics, an important experimental variable is the steady bias light intensity in suns. To establish a corresponding accurate lifetime domain, the laser induced carrier decay is measured with the steady-state bias light intensity varied in steps $I_1, I_2, \ldots I_k$ as illustrated in FIG. 2. For each illumination intensity, the laser induced decay $\delta n_{Laser}(t)$ is analyzed similar to an illustration given in FIG. 5. QD values obtained for each decay are plotted as a function of the steady-state light intensity, I. The results give QD vs. steady-state light intensity plots, as illustrated in FIG. 8A and in FIG. 8B for the same semiconductor sample wafers as those in FIG. 6A and FIG. 6B, respectively. It is seen that the accurate lifetime domains are distinctly different for these samples.

Figure 8B:
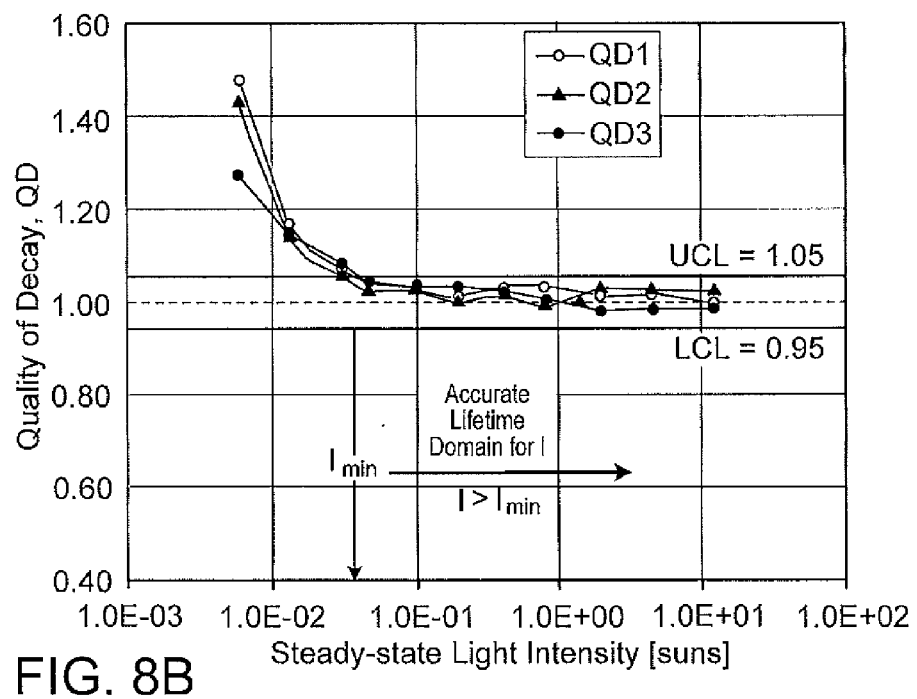

For illustration of QD behavior during carrier decay, three consecutive sets of QD values are shown in FIGS. 8A and 8B, as defined in FIG. 5, i.e. the $QD_1$, referred to simply as QD, then $QD_2$, and $QD_3$. In practice, to establish the desired measuring conditions it can be sufficient to analyze only QD. The desired accuracy of the carrier decay lifetime measurement method can be selected by the specified intervals separating QD limits from an ideal exponential decay QD=1 value.

In the case of FIG. 8A and FIG. 8B, control limits are separated from 1 by the interval Δ that is 5%. Narrower specification, for example Δ=2.5%, could be used for certain applications where higher precision is needed; such as the measurement of $J_0$, the emitter saturation current, that extracts, $J_0$ from the slope of $1/\tau_{e\!f\!f}^2$ 1/vs. steady bias light intensity.

Figure 9A:
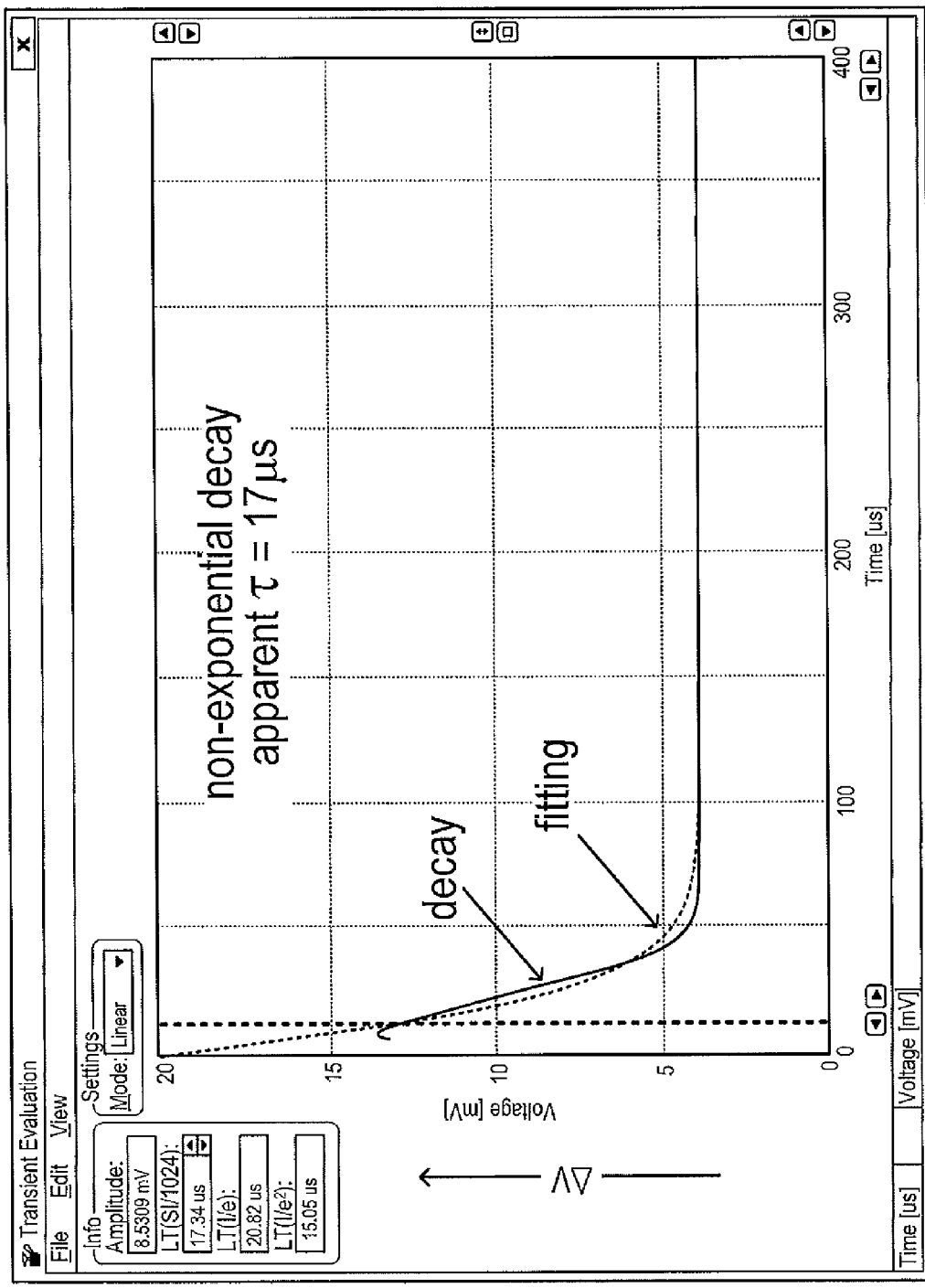
FIGS. 9A through 9D are plots illustrating the advantages of the method, in obtaining an exponential carrier decay and in achieving lifetime measurement with an exponential decay constant independent of the laser pulse power. The results were obtained with QSS-μPCD measurements on silicon photovoltaic p+−n−p+ emitter test structures.
Figure 9B:
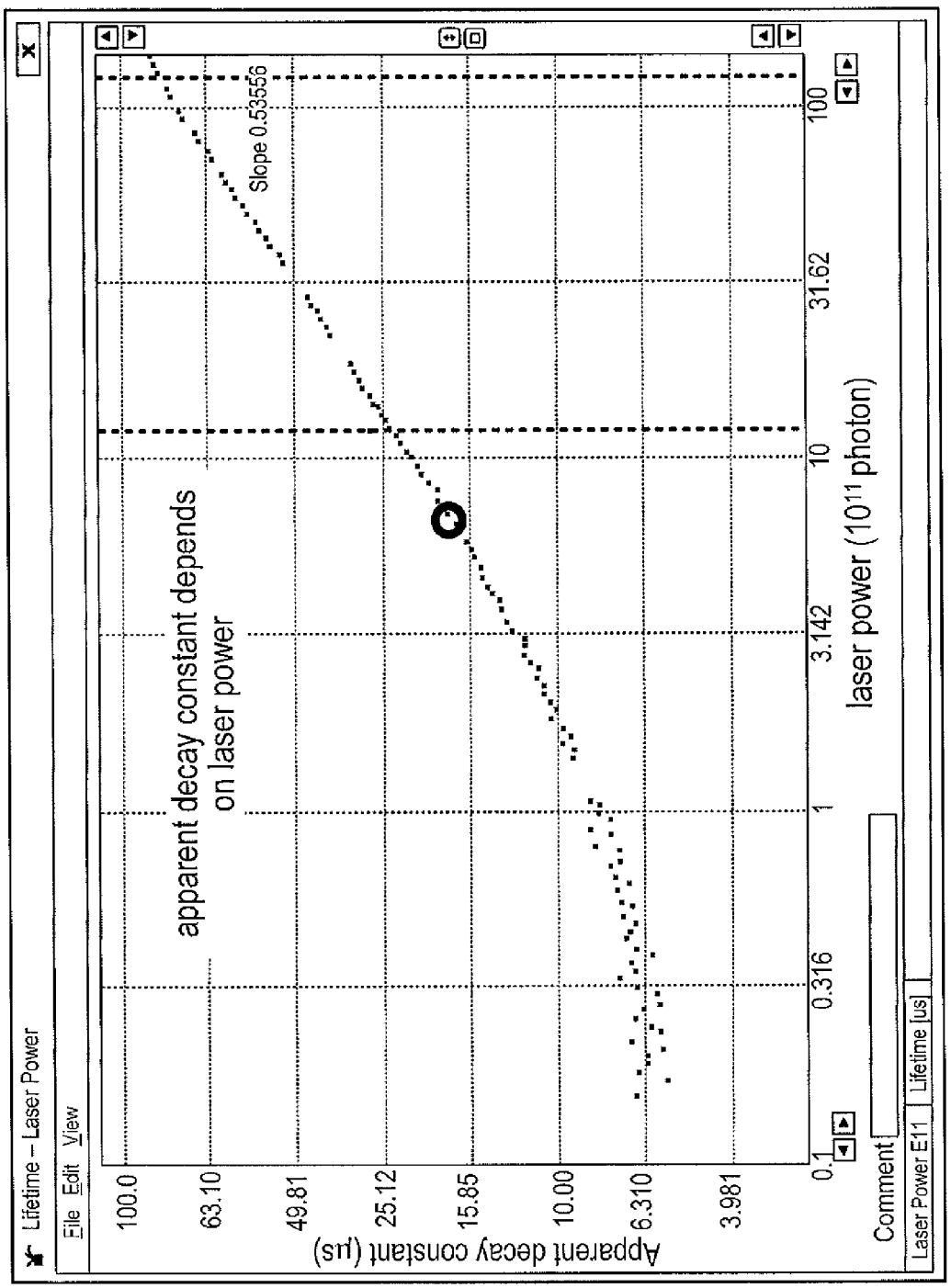
Figure 9C:
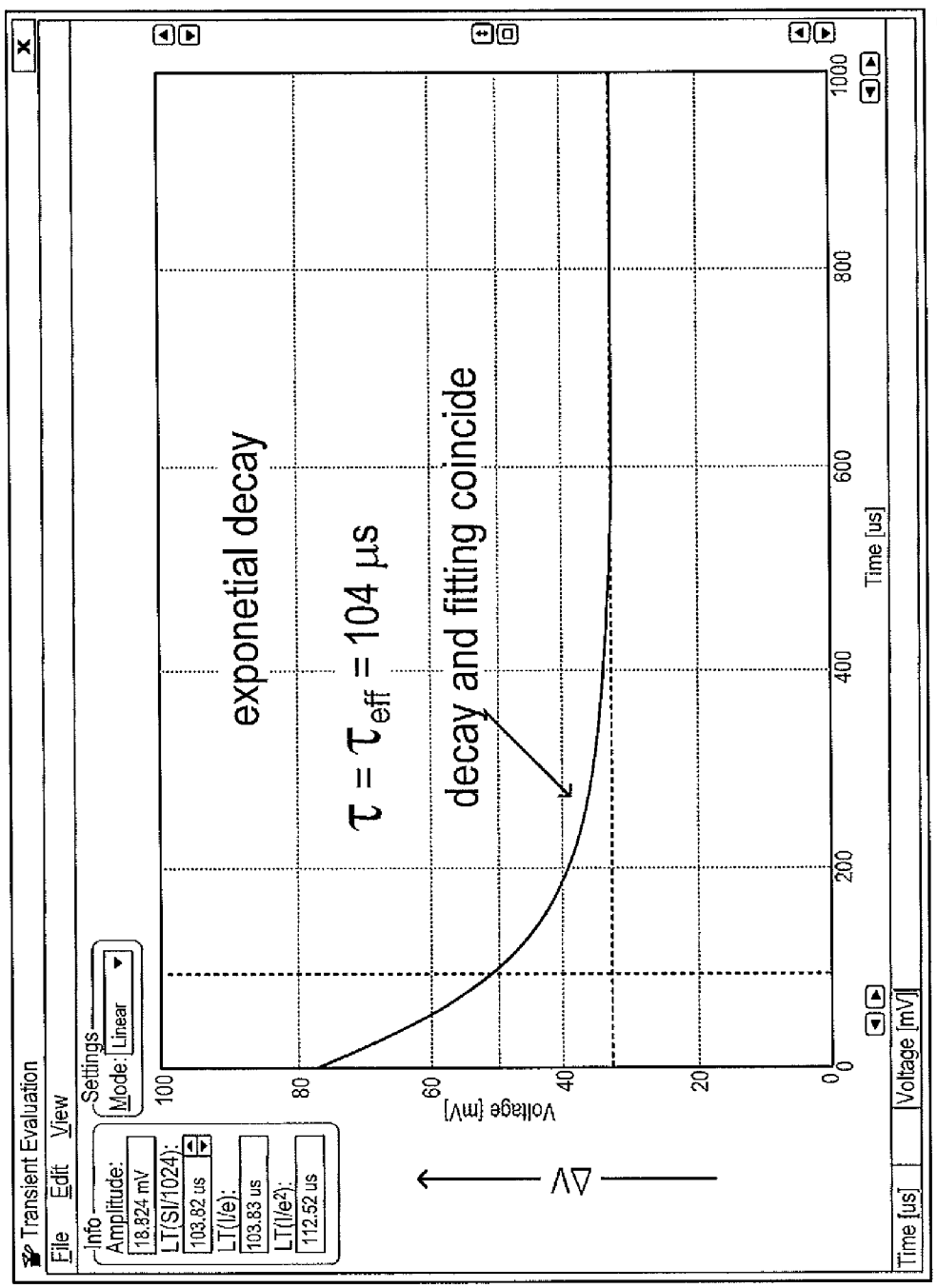
Figure 9D:
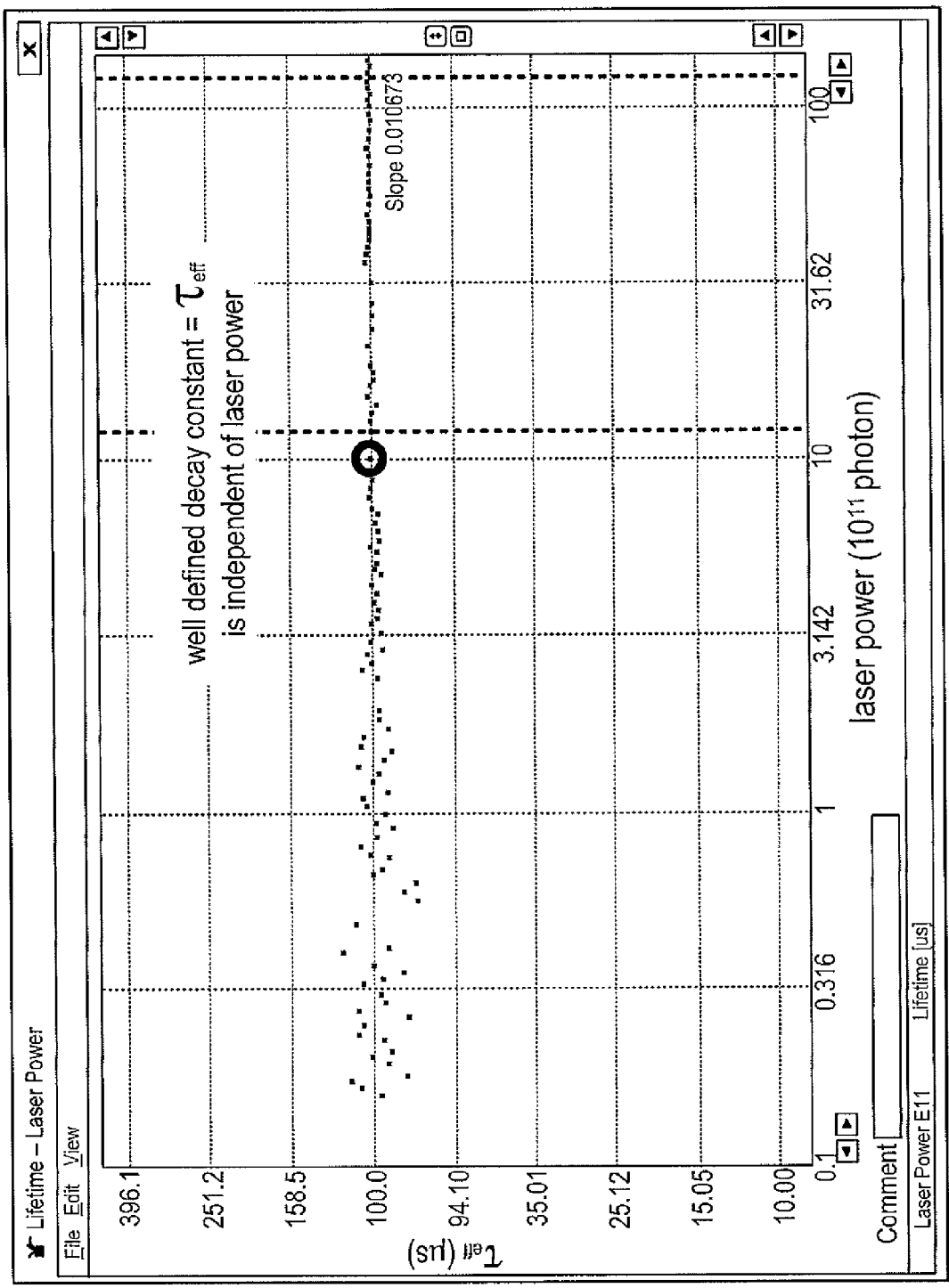

FIGS. 9A-9D present additional results of microwave detected photoconductance decay measurements. FIGS. 9A and 9B on the left side present results typical for I<$I_{min}$, that is outside the quality of decay control limits, i.e., outside of the accurate lifetime domain. The right side FIGS. 9C and 9D present results typical for measurement within the quality of decay control limits.

An advantage of performing the lifetime measurements within the quality of decay control range is twofold. First, the carrier decay becomes exponential (as is evident comparing FIGS. 9A and 9C, and secondly, the decay constant becomes practically independent of the laser pulse power (as is evident comparing FIGS. 9 and 9D). The first advantage was discussed above as an element necessary for reliable carrier lifetime determination from carrier decay. The second one is of practical importance for increasing signal to noise ratio and the speed of measurement.

Increasing of laser pulse power while maintaining QD close to 1 gives larger μPCD signals, ΔV, and as a result, improves signal to noise ratio in carrier decay lifetime measurements. This is seen in FIG. 9D as lower spreading of lifetime measurement results for higher power.

Decreasing noise enables reducing the number of decay averaging, which gives shorter measuring time. This can be important for mapping of lifetime distribution on the wafers.

It can therefore be recommended when using the decay quality control procedure and measurement in the range, $I_{min}$ to $I_{max}$, that the laser pulse power is set at high levels as long as QD is within the specification limits.

In certain embodiments, the size of light beams is a variable that can significantly affect the reliability of the decay lifetime measurement.

Traditionally, carrier decay lifetime measurements are based on the assumption of one dimensional excess carrier diffusion across the wafer thickness and assume a negligible role of lateral carrier spreading from the excitation area. These assumptions may not be valid for silicon wafers with high lifetime values and especially for measurements using too small laser pulse spot and too small steady bias light spot. Increasing of excitation spot size reduces interference from lateral carrier spreading; however, it has to be done very carefully considering the conflict with the practical need for high spatial resolution in the whole wafer mapping of lifetime.

The quality of decay control technique enables to quantitatively determine the effect of excitation spot sizes and to optimize the illumination system in the measurement apparatus considering practical needs.

Figure 10A:
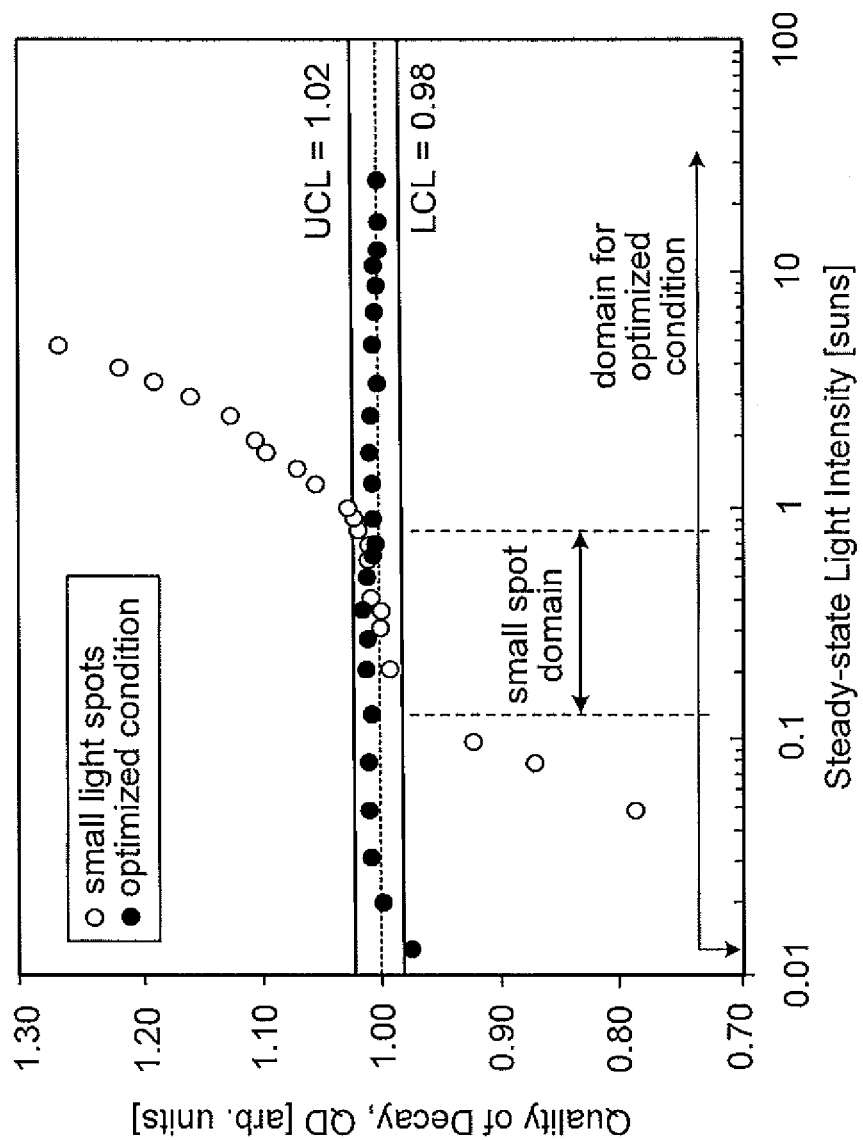
FIGS. 10A and 10B are plots illustrating the effect of optimization of the illumination spot that eliminates long decay manifested by QD>1. After optimization the measurement with QD close to 1 was realized over a large intensity range.
Figure 10B:
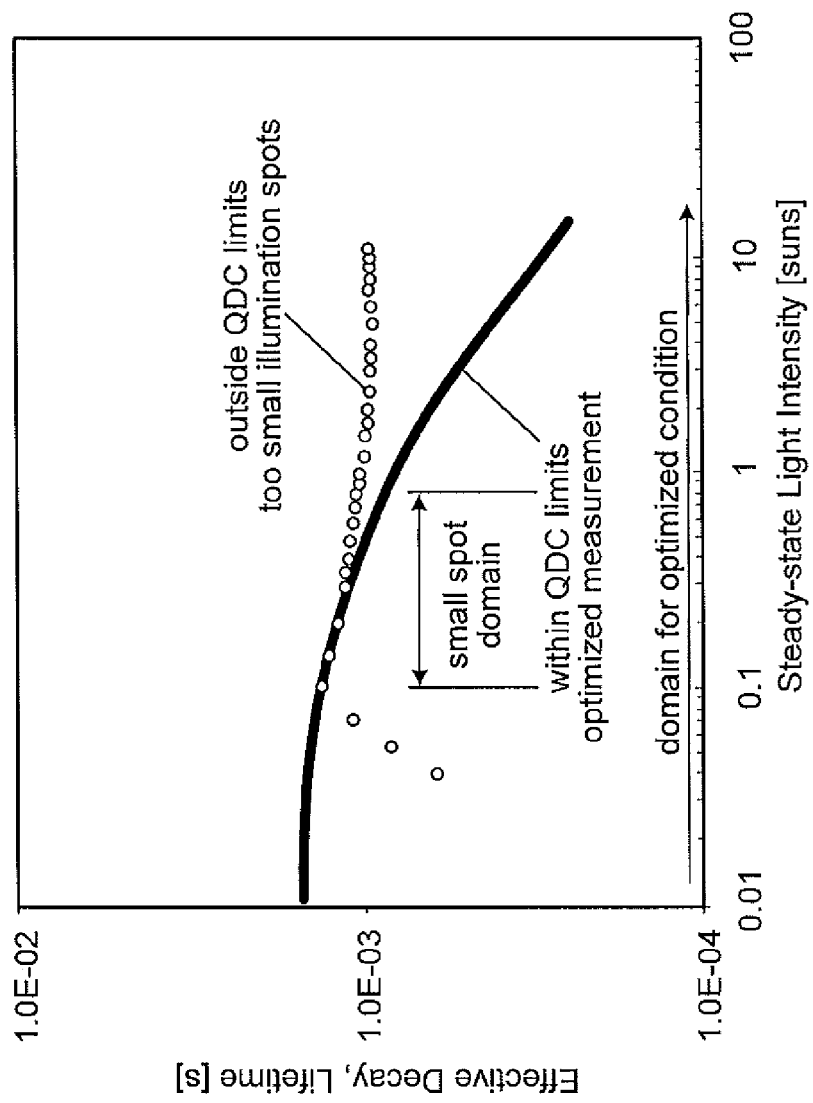

This is illustrated in FIGS. 10A and 10B, which compares results of measurements using small spot and measurements with an optimized larger spot.

FIG. 10A presents the quality of decay control chart with QD results for small light spots (1 mm for pulsed laser beam and 2 mm diameter for bias light beam) and for large light spots (9 mm for pulsed laser beam and 12 mm for bias light beam). The accurate lifetime measurement for the large spot extends over the entire steady-state light intensity range, while for small spot a reliable measurement is possible only in a narrow domain from 0.2 to 0.8 suns.

As seen in FIG. 10B above the domain small spot measurement results in a significant overestimation of the lifetime which is unacceptable in silicon PV monitoring. Where an intensity above 1 sun is used for determination of the emitter saturation current $J_0$.

An example of the optimization shown in FIG. 10 was realized by increasing the diameter of the pulsed laser spot from 1 mm, used for high resolution mapping to 9 mm that still enables 15×15 matrix mapping of 150×150 mm silicon wafers for photovoltaics.

An additional advantage of accurate determination of small disturbance excess carrier decay lifetime is that this lifetime can also be used for a reliable determination of the emitter saturation current $J_0$, the steady-state lifetime, $\tau_{ss}$, and the injection level, $\Delta n$, corresponding to any steady-state bias light intensity value, I. In the reliable measurement range, established by the present quality of decay control, the $J_0$ is determined from the slope of $1/\tau_{eff}^2$ vs. G where G is the steady-state excess carrier generation rate that is proportional to I, and it is calculated from commonly used relation $$G[\text{in cm}^{-3}\ s^{-1}] = 2.38e17 \frac{I[\text{suns}]}{W[\text{cm}]} \cdot C \qquad (6)$$

where C is the correction factor depending on the light reflection from the illuminated surface.

The steady-state excess carrier effective lifetime, $\tau_{ss}$, is obtained from the measured $\tau_{eff}$ vs. G using a simple integration formula described in "Simplified evaluation method for bias lighted effective lifetime measurements" by F. M. Schuurmans, et. al., Appl. Phys. Lett. 71, 1797 (1997).

In certain embodiments, especially in PV applications, knowledge of the injection level corresponding to a given lifetime value is frequently required. Accurate determination of $\Delta n$ can enable satisfying this practical requirement by carrier decay techniques with steady-state light bias and quality of decay control.

Other embodiments are in the following claims.

What is claimed is:

1. A method of accurate determination of excess carrier lifetime of a semiconductor sample based on measurement of excess carrier decay; method comprising:
    exciting of excess carriers in a semiconductor sample with a steady bias light illumination that generates steady-state excess carrier concentration;
    exciting additional excess carriers with a light pulse imposed on a background steady-state illumination;
    after termination of light pulse excitation, measuring a decay signal represents the excess carriers decay to a steady-state background value;
    determining a quality of decay parameter from a ratio of successive time increment values corresponding to a drop of decay signal by a predetermined factor C in a progressing excess carrier decay; and
    determining an excess carrier lifetime for the semiconductor sample based on a measured decay where the quality of decay value is within a predetermined range indicative of an accurate excess carrier lifetime measurement.

2. The method of claim 1, wherein a predetermined signal drop factor C is larger than 1.

3. The method of claim 1, wherein the predetermined range corresponds to the quality of decay value being at or close to one.

4. The method of claim 1, wherein the decays are measured using a non-contact measurement method.

5. The method of claim 1, wherein the decays are measured using microwave detected photoconductance, radio-frequency inductive coupling, photoluminescence, or free carrier absorption.

6. The method of claim 1, further comprising adjusting conditions under which the decay measurements are made based on values of the quality of decay.

7. The method of claim 6, wherein adjusting the conditions comprises one or more of the following:
    (a) changing values of one or more experimental variables;
    (b) measuring the decay and determining the quality of decay parameter characteristics;
    (c) analyzing the characteristics using a quality of decay control chart with preselected upper and lower control limits;
    (d) identifying an accurate lifetime measurement domain as the set of the experimental variable values for which quality of decay values are within preselected quality of decay control limits; and
    (e) setting conditions under which the decay measurements are made using experimental variables that belong to the accurate lifetime domain.

8. The method of claim 7, wherein the experimental variable is an intensity of the steady-state illumination.

9. The method of claim 8, wherein changing the intensity of the steady-state illumination includes making a decay measurement where the steady-state illumination intensity is zero.

10. The method of claim 6, wherein the conditions are adjusted until the quality of decay is within the predetermined range.

11. The method of claim 1, wherein the excess carrier lifetime and quality of decay value is determined based on a portion of the decay measurement.

12. The method of claim 11, wherein the excess carrier lifetime is determined based on the decay measurement acquired for a highest power of the laser pulse that yields a quality of decay within the predetermined range indicative of an accurate excess carrier lifetime measurement.

13. A method for calibrating a semiconductor measuring apparatus, comprising:
    performing one or more excess carrier lifetime measurements using the method of claim 1 for a test sample while varying at least one measurement parameter of the semiconductor measuring apparatus across a range for which the test sample is known to have a quality of decay within the predetermined range; and calibrating the measuring apparatus based on the excess carrier lifetime measurements.

14. The method of claim 13 wherein the measuring apparatus is a microwave detected photoconductance decay apparatus.

* * * * *